United States Patent [19]

Crop

[11] Patent Number: 4,713,771
[45] Date of Patent: Dec. 15, 1987

[54] DIGITAL MINIMUM-MAXIMUM VALUE SEQUENCE PROCESSOR

[75] Inventor: Roland E. Crop, Banks, Oreg.

[73] Assignee: Tektronix, Inc., Beaverton, Oreg.

[21] Appl. No.: 791,677

[22] Filed: Oct. 28, 1985

[51] Int. Cl.⁴ .......................................... G06F 15/20
[52] U.S. Cl. ................................. 364/487; 364/608; 364/852; 382/29; 328/151; 328/135
[58] Field of Search ............... 364/487, 571, 608, 851, 364/852, 484, 485; 328/135, 151; 358/138; 324/103 R, 103 P; 340/347 M, 347 SH; 382/29

[56] References Cited

U.S. PATENT DOCUMENTS

| | | | |
|---|---|---|---|
| 4,143,363 | 3/1979 | Dotter, Jr. ........................ | 364/608 |
| 4,143,365 | 3/1979 | Cayzac et al. ................... | 328/135 |
| 4,183,087 | 1/1980 | Huelsman ......................... | 364/487 |
| 4,495,586 | 1/1985 | Andrews .......................... | 364/487 |
| 4,509,530 | 4/1985 | Curtis et al. .................. | 346/33 ME |
| 4,510,571 | 4/1985 | Dagostino et al. .............. | 364/487 |
| 4,555,765 | 11/1985 | Crooke et al. ................. | 364/487 |

Primary Examiner—Errol A. Krass
Assistant Examiner—V. N. Trans
Attorney, Agent, or Firm—John P. Dellett

[57] ABSTRACT

In a system for generating a vector representation of a waveform on a cathode ray tube screen, the minimum and maximum magnitudes of an analog waveform acquired during each of successive measurement periods are stored in a random access memory, with the minimum and maximum signal values for each measurement period being stored in arbitrary order. The minimum and maximum signal values within each measurement period are then time sequenced by selectively comparing the minimum and maximum values obtained during each such measurement period with the values obtained during preceding and/or succeeding periods. Also according to these selected maximum and minimum comparisons, the maximums obtained during selected measurement periods are decremented by a selected amount while minimums obtained during selected periods are incremented by a selected amount. The waveform is then reproduced utilizing these ordered and selectively altered minimums and maximums to establish the coordinates on the screen of a sequence of vectors representing the waveform.

9 Claims, 12 Drawing Figures

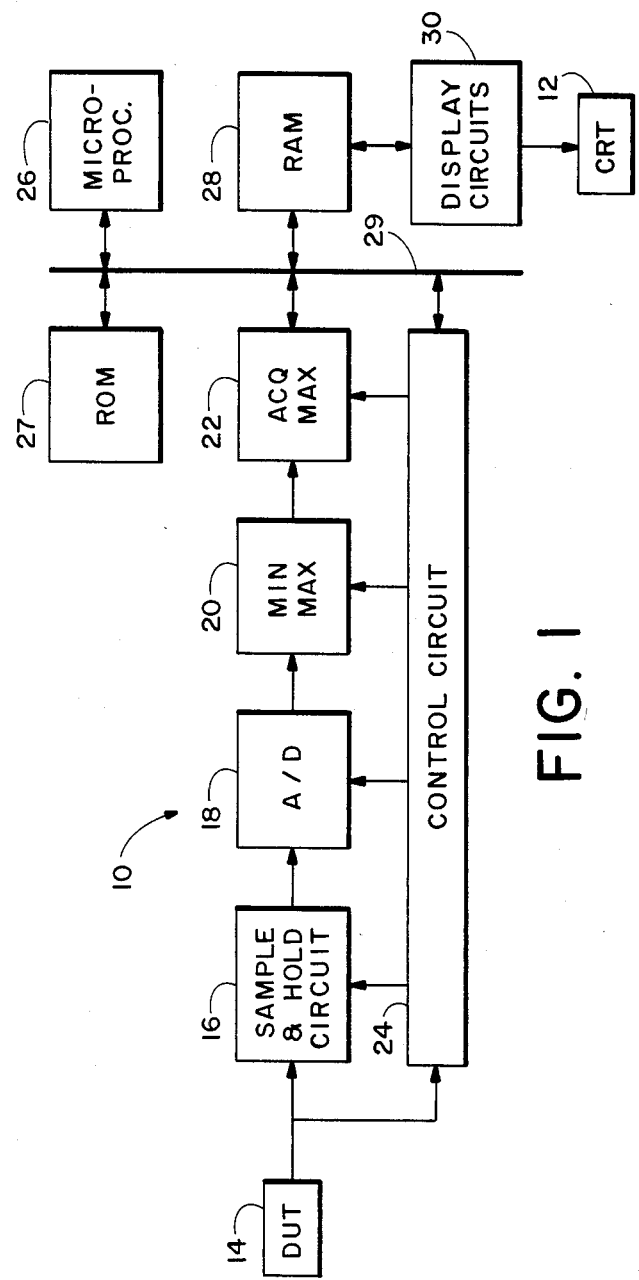

P1 P2 P3 P4 P5 P6 P7 P8 P9

DIGITAL MINIMUM-MAXIMUM VALUE SEQUENCE PROCESSOR

BACKGROUND OF THE INVENTION

The present invention relates in general to systems for digitally representing analog waveforms and in particular to a system for processing digitized waveform data to produce a vector sequence representing the waveform.

Digital storage oscilloscopes typically convert a waveform into a series of digital values representing the magnitude of the waveform at regular sampling intervals, the digital data being stored sequentially in a random access acquisition memory as the waveform is sampled. Vector cathode ray tube oscilloscopes typically utilize the stored data to establish a series of vector coordinates on a cathode ray tube screen, recreating the analog waveform by drawing vectors (i.e. straight lines) from point-to-point on the screen. The accuracy of the representation improves with sampling rate since the acquired data will be more likely to reflect high frequency phenomona in the waveform. However a higher sampling rate requires a larger acquisition memory to store the acquired data. A larger acquisition memory is also required if a longer waveform is to be sampled and displayed with the same accuracy.

One method of improving accuracy without increasing the size of the acquisition memory involves sampling the waveform at a high sampling rate but storing in the acquisition memory only the minimum and maximum data values acquired during successive sampling intervals. The waveform is then reproduced using these minimum and maximum values as the vector coordinates for the vectorized waveform display, the vector coordinates being plotted in minimum-maximum-minimum-maximum fashion.

The accuracy of the representation is improved if the maximum and minimum of each sampling period are plotted in the order in which they occur. In the past this has been accomplished by employing a maximum/minimum detector having circuitry which keeps track of the order in which the maximum and minimum occur during each sampling period and then transfers the data to the acquisition memory in the proper order at the end of each sampling period. However the proper ordering of the data prior to storage in the acquisition memory requires additional circuitry in the minimum/maximum detector and can require additional steps during data acquisition which can affect the maximum sampling rate.

Even with the maxima and minima properly ordered, the waveform reproduction is distorted by the placement of the maxima and minima. For instance in a smoothly rising waveform, the minimum occurs at the beginning of each sampling period while the maximum occurs at the end of each period. But normally the vector endpoints are plotted at regular intervals on the CRT screen, the minimum point for each sampling period being plotted at the one quarter period point and the maximum point being plotted at the three-quarter period point. In this way the waveform is represented by a series of vectors connected end-to-end, each having the same horizontal displacement and a vertical displacement according to the difference between the successive maximum and minimum levels. In a smoothly rising waveform, the maximum for one period would be substantially equal to the minimum of the next period. Thus a horizontal vector one half-period long would connect the maximum of one sampling period to the minimum of the next and a smoothly rising waveform would therefore be represented as an increasing saw-tooth, or stepped waveform. Distortion would also occur on the falling portion of the waveform.

SUMMARY OF THE INVENTION

According to one aspect of the invention, the minimum and maximum values of an analog waveform acquired during each of successive measurement periods are stored in a random access memory, the minimum and maximum for each measurement period being stored in mimimum-maximum (or maximum-minimum) order. After all the waveform data has been acquired, the order of the minimum and maximum within each measurement period is determined by selected comparisons between the minimum and maximum values obtained during such measurement period with the values obtained during preceding and succeeding measurement periods. The waveform is then reproduced utilizing these ordered minimums and maximums to establish the coordinates of a sequence of display vectors. Since the order of the maximums and minimums is determined after the maximum and minimum data is acquired and stored, no special circuitry is required to establish the maximum/minimum order as the waveform is being sampled.

According to another aspect of the invention, maximums obtained during selected measurement periods are decremented by a selected amount while minimums obtained during selected measurement periods are incremented by a selected amount, thereby eliminating the otherwise stepped appearance of the displayed vector waveform representations. The determination as to whether the maximum or the minimum of a given measurement period is to be decremented or incremented is also based on selected comparisons of the maximum and minimum values acquired during the measurement period with the values acquired during preceding and succeeding periods.

It is therefore an object of the invention to provide a new and useful method for representing the amplitude variations of an analog waveform using acquired minimum and maximum value data acquired during successive measurement intervals.

It is another object of the invention to provide such a method wherein the acquired minimum and maximum values are properly ordered to provide a more accurate basis for vector representation of the waveform.

It is a further object of the invention to provide such a method wherein the acquired minimum and maximum values are adjusted in magnitude to provide a still more accurate basis for vector representation of the waveform.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a block diagram of a digital storage oscilloscope capable of performing the method of the present invention;

DETAILED DESCRIPTION

Figures 2A, 2B, 2C, 2D, 2E:
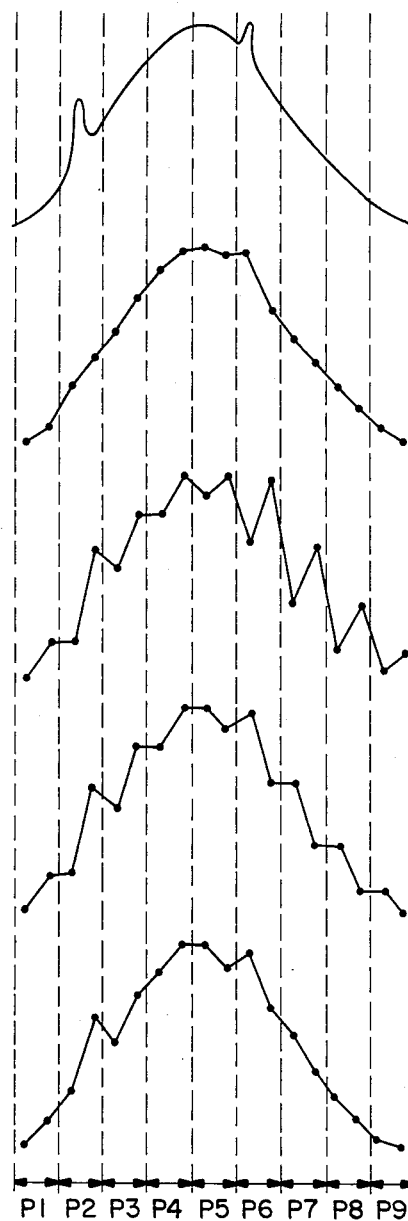
FIG. 2A depicts a typical analog waveform.
FIG. 2B is a point-to-point vector representation of the waveform of FIG. 2A, according to the prior art.
FIG. 2C is a non-ordered minimum/maximum vector representation of the waveform of FIG. 2A according to the prior art.
FIG. 2D is an ordered minimum/maximum vector representation of the waveform of FIG. 2A according to the present invention.
FIG. 2E is an ordered, adjusted minimum/maximum representation of the waveform of FIG. 2A according to the present invention.

Referring to FIG. 1, a waveform acquisition and display system 10, depicted in block diagram form, is adapted to produce a representation of a waveform generated by a device under test 14 on a screen of a cathode ray tube 12. The magnitude of the waveform is sampled and held at a plurality of points during each of a succession of sampling periods by a sample and hold circuit 16. The sampled waveform magnitudes are then converted to proportional digital values by an analog-to-digital converter 18. The digital values are applied as inputs to a minimum/maximum detector circuit 20 which determines the maximum and minimum digital values associated with the waveform samples acquired during each sampling interval. At the end of such sampling period the minimum and maximum values for the period are transmitted from circuit 20 to a random access acquisition memory 22 and stored therein, with minimum and maximum data values for successive sampling periods being stored at successive addresses, the maximum and minimum associated with each sampling period being stored in arbitrary order, suitably minimum first, then maximum.

The timing for the sample and hold circuit 16, converter 18, and minimum/maximum circuit 20 is Provided by a control circuit 24, which also provides write strobe and address control for memory 22 during data acquisition. The waveform being sampled is also applied as an input to control circuit 24 which may be set to trigger acquisition start or stop with respect to a selected level of the sampled waveform. Circuits capable of performing the functions of blocks 16, 18, 20, 22 and 24 are well known in the art and are not further detailed herein.

The minimum/maximum data thus stored in acquisition memory 22 is accessed by a microprocessor 26 by means of a bus 29 having data, address and control lines. Processor 26, under program control from a program stored in a read only memory 27, then stores in a display area of a random access memory 28, also connected to bus 29, a vector data sequence derived from the data stored in acquisition memory 22. The vector data in RAM 28 is further accessed by a display driver circuit 30 which uses the vector data to produce a vector representation of the waveform on CRT 12. Processor 26 may also access control circuit 24 through bus 29 for purposes of setting data acquisition control and timing parameters of circuit 24 and for initiating data acquisition.

FIG. 2A depicts a typical analog waveform to be sampled at a plurality of points during each of several successive sampling periods. The sampling periods are labeled P1 through P9. Acquisition memory 22 of FIG. 1 is of sized to store two data values during each sampling period for a sampled waveform of a given length. FIG. 2B is a representation of the waveform as it would appear on CRT 12 according to a point-to-point method of the prior art wherein only two sample points are sampled, held and digitized at regular intervals during each sampling period and stored sequentially in acquisition memory 22, without making use of minimum/maximum circuit 20. The image on CRT 12 is formed by a set of vectors connecting successive vector coordinates on the CRT screen. Each point corresponds to one waveform sample point and has a horizontal displacement proportional to the sample time and a vertical displacement proportional to the sample magnitude. The waveform representation of FIG. 2B is relatively smooth but lacks some of the detail of the actual waveform. In particular, the momentary peak on the rising portion of the waveform of FIG. 2A during sampling period P2, due for instance to a noise spike, is not apparent in the representation of FIG. 2B because the spike happened to occur between the two sample points taken during the sampling period. On the other hand, the spike occurring during period P6 does affect the display of FIG. 2B because the first of the two sample points taken during the sampling period happened to occur near the spike peak.

The use of the minimum/maximum detection circuit 20 of FIG. 1 permits the display of a waveform representation according to a simple "min/max/min/max" method of the prior art shown in FIG. 2C. According to this method, a large number of samples is taken during each sampling period and only the minimum and maximum waveform values detected during each period are stored in acquisition memory 22. The waveform image is then created on the CRT using the minimum and maximum values to establish the display vector end points. In this method the minimum value acquired during each display period is assumed to occur first and the maximum is assumed to occur second, because that is the order in which the data is stored in the acquisition memory. When the waveform is reproduced using this method, the peaks occurring during periods P2 and P6 are more likely to appear in the vector representation of the waveform than in the point-to-point method of the prior art because the sampling rate is higher. However, the representation of the waveform according to this method is severely distorted, showing peaks, particularly during the falling portions of the waveform, where there are in fact no such peaks in the sampled waveform. The effect appears in sampling periods wherein the waveform magnitude is falling because the maximums actually occur before the minimums. A similar false peak display would occur during sampling periods wherein the waveform is rising if the maximum for each sampling period was plotted before the minimum.

FIG. 2D is a vector representation of the waveform of FIG. 2A as would be displayed on CRT 12 of FIG. 1 according to the method of the present invention wherein either the minimum or the maximum for each sampling period may be selectively plotted first. The selection of the minimum or the maximum value to be plotted first is made by selectively comparing the maximum and minimum values obtained during the sampling period with the values acquired during the preceding sampling period and with the values acquired during the next two succeeding sampling periods. When the vector representation is made according to the method of the present invention, the waveform peaks occurring during periods P2 and P6 are apparent but the false peaks appearing during periods P5, P6, P7, P8 and P9 in the display of FIG. 2C are eliminated and the waveform representation of FIG. 2D more closely resembles the actual waveform of FIG. 2A than does the representation of FIG. 2C.

The order in which the maximums and minimums for any current sampling period are plotted is determined according to the following sequencing rules:

1. The minimum of a sampling period is plotted before the maximum if the maximum value obtained during the preceding period, if any, is less than or equal to the sum of the minimum value obtained during the current sampling period and a selected error amount.
2. The minimum of a sampling period is plotted before the maximum if one half of the sum of the maximum and minimum values (the "midpoint value") of the sampling period and the maximum value obtained during the succeeding sampling period both exceed the maximum value obtained during the preceding sampling period, if any.
3. The minimum of a sampling period is plotted before the maximum if there is no preceding period and the maximum value obtained for the sampling period is less than or equal to the sum of the minimum value obtained for the succeeding period and the selected error amount.
4. The minimum of a sampling period is plotted before the maximum if there is no preceding period and the midpoint value of the first succeeding sampling period and the maximum value of the second succeeding sampling period both exceed the maximum value of the sampling period.
5. The maximum of a sampling period is plotted before the minimum if the sum of the minimum value obtained during the preceding period and the minus error amount is equal to or greater than the maximum value obtained during the sampling period.
6. The maximum of a sampling period is plotted before the minimum if the midpoint value of the sampling period and the minimum value obtained during the succeeding sampling period are both less than or equal to the minimum value obtained during the preceding sampling period.
7. The maximum of a sampling period is plotted before the minimum if there is no preceding period and the sum of the minimum value obtained for the current period and the error amount is greater than or equal to the maximum value obtained for the succeeding period.
8. The maximum of a sampling period is plotted before the minimum if there is no preceding period and the midpoint value of the first succeeding sampling period and the minimum value of the second succeeding sampling period both are less than or equal to the minimum value of the current sampling period.
9. The maximum of a sampling period is plotted before the minimum if the maximum/minimum order cannot be determined according to the above eight rules and the maximum of the previous period was plotted after the minimum of the previous period.
10. The minimum of a sampling period is plotted before the maximum when the maximum/minimum order cannot be determined according to the above nine rules and the maximum for the preceding sampling period was plotted first.
11. The minimum of a sampling period is plotted before the maximum if the maximum/minimum order cannot be determined according to any of the above ten rules.

The selected "error amount" mentioned in the above rules may be zero, but is more appropriately set to a value which allows for the sampling and digitizing accuracy of the system. A rule of thumb for an error amount which typically produces a good result is found by dividing the difference between the maximum and minimum waveform values acquired during the period by eight. However the error amount may be larger or smaller than this rule of thumb amount.

By way of an example of the application of rule 1 above, the minimum of period P2 is plotted first in FIG. 2D because the maximum for period P1 is less than the minimum value obtained during period P2. Similarly, the minimum of period P4 was plotted first according to rule 2 since the midpoint value of period P4 and the maximum of period P5 both exceed the maximum for period P3. The minimum for period P1 is plotted first according to rule 3 because there is no preceding period and the maximum value for period P1 is less than the minimum value obtained for period P2. The maximum value for period P7 is plotted first according to rule 5 because the minimum value for period P6 equals or exceeds the maximum value of period P7. The maximum value of period P6 is plotted first according to rule 6 because the midpoint value of period P6 and the minimum value for period P7 are both less than or equal to the minimum value obtained during period P5.

The ordering of the maximum and minimum points according to the above rules produces a representation of the waveform more closely resembling the original waveform than is possible when the minimum and maximum points are arbitrarily ordered as in FIG. 2C. However, it is noted that the waveform representation of FIG. 2D is still not as smooth as the original waveform of FIG. 2A since the representation of FIG. 2C exhibits an apparent "stepped" effect when the original waveform is smoothly increasing or decreasing. For example, the vector extending from the second point of period P7 to the first point of period P8 is substantially horizontal. The waveform is steadily declining during periods P7 and P8 so that the minimum value of the waveform during period P7 occurs at the end of the period and is substantially equal to the maximum of the waveform during period P8, occurring at the beginning of the period. Since the maximums and minimums are plotted within each period at points one-quarter and three-quarters of the distance from the beginning of the period to the end of the period, the minimum of a period in which the waveform is smoothly declining is displaced one-half period from the maximum of the next succeeding period. The interconnecting vector is therefore substantially horizontal. The stepped display effect arises in a similar fashion during a smoothly increasing portion of the waveform because of this manner in which the maximum and minimums for successive periods are separated.

In another aspect of the invention, as illustrated in FIG. 2E, selected maximum values are decremented and selected minimum values are incremented by selected offset amounts to reduce or eliminate the stepped effect apparent in FIG. 2D. The resulting display thereby more closely resembles the actual waveform of FIG. 2A. The offset amount is suitably one fourth of the difference between the maximum and minimum values obtained during the period. However, not every maximum and minimum is altered by the offset amount; the determination as to whether a maximum or minimum of any period is to be altered by the offset amount is also made by selectively comparing the maximum and minimum values acquired during the period with maximum and minimum values acquired during preceding and succeeding periods.

The maximum and minimum values are altered according to the following alteration rules:

a. The minimum value acquired during a sampling period is incremented by the offset amount when the waveform is determined to be rising during the preceeding period (i.e., the minimum for the previous period was plotted before the maximum according to rules 1-11 hereinabove) and the maximum value acquired during the preceding period is less than or equal to the sum of the minimum value acquired during the sampling period and the error amount.

b. The minimum value acquired during a sampling period is incremented by the offset amount when the waveform is determined to be falling during the sampling period (i.e., the maximum value acquired during the sampling period is plotted before the minimum according to rules 1-11 hereinabove) and the sum of the minimum for the sampling period and the minus error amount is greater than or equal to the maximum value for the succeeding period.

c. The maximum value acquired during a sampling period is decremented by the offset amount when the waveform is determined to be falling during the preceding period and the sum of the minimum value acquired during the preceding period and the minus error amount is less than or equal to the maximum value acquired during the sampling period.

d. The maximum value acquired during a sampling period is decremented by the offset amount when the waveform is determined to be rising during the sampling period and the maximum for the sampling period is less that or equal to the sum of the minimum value for the succeeding period and the error amount.

Referring to FIG. 2E, the minimum for period P4 was incremented by the error amount according to rule a, the minimum for period P6 was incremented according to rule b, the maximum for period P7 was decremented according to rule c, and the maximum for period P3 was decremented according to rule d.

Hereinbelow is a listing of a high level program for microprocessor 26 implementing the method of the present invention for accessing, ordering and altering the maximum and minimum values stored in the acquisition memory 22 following digitization or a waveform. In the listing, the following variables are used:

MAX: The maximum value for a current sampling interval.
MIN: The minimum value for a current sampling interval.
NMAX: The maximum value for the next sampling interval after the current interval.
NMIN: The minimum value for the next sampling interval after the current interval.
NMID: One half the difference between NMAX and NMIN.
NNMAX: The maximum value for the second sampling interval after the current interval.
NNMIN: The minimum value for the second sampling interval after the current interval.
ERR: An offset amount.
FLAG: A variable which indicates whether the minimum or maximum is to be plotted first, and whether the first point plotted is to be incremented or decremented.
FLAG has the following possible values:
  1: MIN precedes MAX with MIN incremented;
  2: MIN precedes MAX, MIN not incremented;
  3: MAX precedes MIN with MAX decremented;
  4: MAX precedes MIN, MAX not decremented; and
  5: Initialized value.
OFFSET: The offset amount for incrementing or decrementing MIN or MAX.
LEN: A variable indication of the number of minimum and maximum points to be processed.
MEMADDR: A pointer to a current acquisition memory address.

The program listing follows.

```
        LBL1 (Start of subroutine)
        INITIALIZE MEMADDR, FLAG, AND LEN
        LBL2 (First loop point)
       *MEMADDR = MEMADDR +2
        GET MIN AT MEMADDR
        GET MAX AT MEMADDR+1
        GET NMIN AT MEMADDR+2
        GET NMAX AT MEMADDR+3
        GET NNMIN AT MEMADDR+4
        GET NNMAX AT MEMADDR+5
        NMID = (NMAX-NMIN)/2
        ERR = (MAX-MIN)/8
        OFFSET = (MAX-MIN)/4
IF MAX<=NMIN+ERR THEN
   IF FLAG = 1 THEN
      MIN = MIN + OFFSET
      MAX = MAX - OFFSET
      PLOT MIN THEN MAX
      SET FLAG = 1
      GOTO LBL2
   IF FLAG = 2 THEN
      MAX = MAX - OFFSET
      PLOT MIN THEN MAX
      SET FLAG = 1
      GOTO LBL2
   IF FLAG = 3 THEN
      MAX = MAX - OFFSET
      PLOT MAX THEN MIN
      SET FLAG = 2
      GOTO LBL2
   IF FLAG = 4 THEN
      PLOT MAX THEN MIN
      SET FLAG = 2
      GOTO LBL2
   IF FLAG = 5 THEN
      MAX = MAX - OFFSET
```

```
        PLOT MIN THEN MAX
        SET FLAG = 1
        GOTO LBL2
    IF MIN>=NMAX-ERR THEN
        IF FLAG = 1 THEN
            MIN = MIN + OFFSET
            PLOT MIN THEN MAX
            SET FLAG = 4
            GOTO LBL2
        IF FLAG = 2 THEN
            PLOT MIN THEN MAX
            SET FLAG = 4
            GOTO LBL2
        IF FLAG = 3 THEN
            MIN = MIN + OFFSET
            MAX = MAX - OFFSET
            PLOT MAX THEN MIN
            SET FLAG = 3
            GOTO LBL2
        IF FLAG = 4 THEN
            MIN = MIN + OFFSET
            PLOT MAX THEN MIN
            SET FLAG = 3
            GOTO LBL2
        IF FLAG = 5 THEN
            MIN = MIN + OFFSET
            PLOT MAX THEN MIN
            SET FLAG = 3
            GOTO LBL2
    IF MAX<=NMID THEN
        IF NNMAX>=MAX THEN
            IF FLAG = 1 THEN
                MIN = MIN + OFFSET
                PLOT MIN THEN MAX
                SET FLAG = 2
                GOTO LBL2
            IF FLAG = 2 THEN
                PLOT MIN THEN MAX
                SET FLAG = 2
                GOTO LBL2
            IF FLAG = 3 THEN
                MAX = MAX - OFFSET
                PLOT MAX THEN MIN
                SET FLAG = 2
                GOTO LBL2
            IF FLAG = 4 THEN
                PLOT MAX THEN MIN
                SET FLAG = 2
                GOTO LBL2
            IF FLAG = 5 THEN
                PLOT MIN THEN MAX
                SET FLAG = 2
                GOTO LBL2
    IF MIN>=NMID THEN
        IF NNMIN<= MIN THEN
            IF FLAG = 1 THEN
                MIN = MIN + OFFSET
                PLOT MIN THEN MAX
                SET FLAG = 4
                GOTO LBL2
            IF FLAG = 2 THEN
                PLOT MIN THEN MAX
                SET FLAG = 4
                GOTO LBL2
            IF FLAG = 3 THEN
                MAX = MAX - OFFSET
                PLOT MAX THEN MIN
                SET FLAG = 4
                GOTO LBL2
            IF FLAG = 4 THEN
                PLOT MAX THEN MIN
                SET FLAG = 4
                GOTO LBL2
            IF FLAG = 5 THEN
                PLOT MAX THEN MIN
                SET FLAG = 4
                GOTO LBL2
        ELSE
            IF FLAG = 1 THEN
                MIN = MIN + OFFSET
                PLOT MIN THEN MAX
                SET FLAG = 4
                GOTO LBL2
            IF FLAG = 2 THEN
                MIN = MIN + OFFSET
                PLOT MIN THEN MAX
                SET FLAG = 4
                GOTO LBL2
            IF FLAG = 3 THEN
                MAX = MAX - OFFSET
                PLOT MAX THEN MIN
                SET FLAG = 2
                GOTO LBL2
            IF FLAG = 4 THEN
                PLOT MAX THEN MIN
                SET FLAG = 2
                GOTO LBL2
            IF FLAG = 5 THEN
                PLOT MIN THEN MAX
                SET FLAG = 4
                GOTO LBL2
STOP
```

Figure 3A:
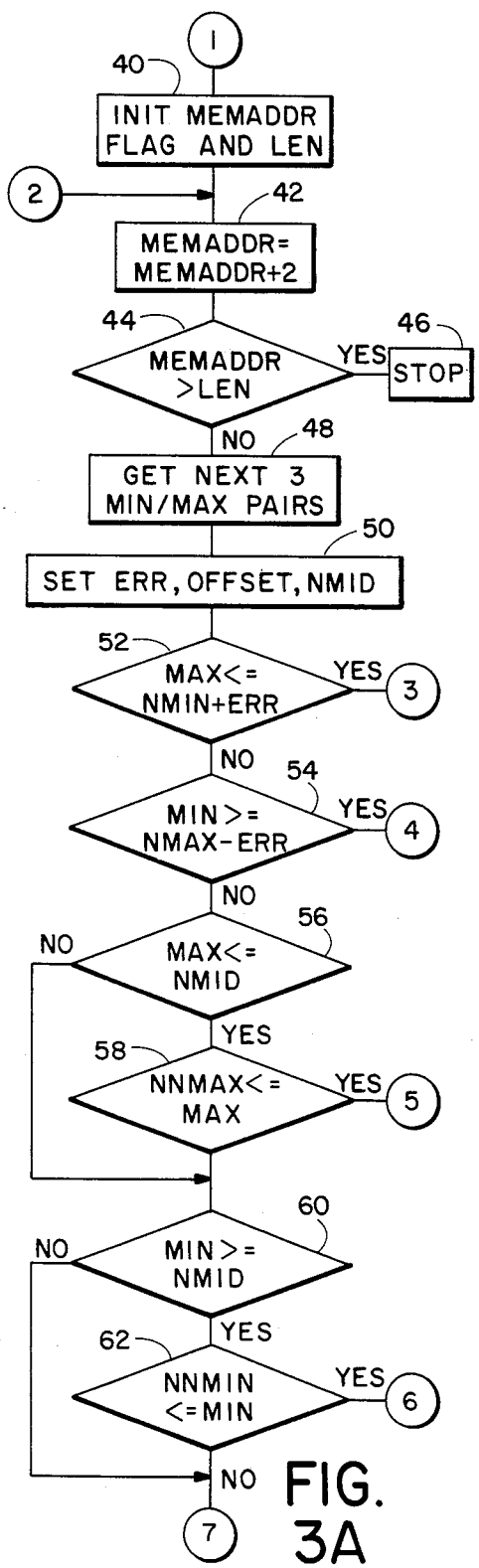
FIGS. 3A-3F are a flowchart of a computer program for performing the method of the present invention.

FIGS. 3A–3E comprise a flow chart of the above program. Referring to FIG. 3A, the program begins at label 1 and is directed to block 40 where the MEMADDR variable is initialized to a value two less than the starting address of the desired waveform data in the acquisition memory. Also, the FLAG variable is initialzed to 5 and the LEN variable is initialized to the number of minimum/maximum pairs in the acquisition memory to be processed. Program flow then passes to block 42 where the MEMADDR variable is incremented by two. Next, in block 44, if MEMADDR is greater than LEN the data processing operation is complete and block 44 directs flow to block 46 where the program stops and is returned to a calling routine. If MEMADDR is not greater than LEN, the procedure moves to block 48.

In block 48 the minimum and maximum values (MIN and MAX) for a current sampling period, along with the minimum and maximum values for the next two succeeding sampling periods (NMIN, NMAX, NNMIN, and NNMAX), are read from MEMADDR and the next five addresses of the acquisition memory. Then in block 50, the ERR, OFFSET, and NMID variables are computed from the MIN and MAX data for the current period. Next, block 52 diverts the program to label 3 in FIG. 3B if MAX is less than or equal to NMIN+ERR and otherwise selects block 54. Block 54 branches the program to label 4 of FIG. 3C if MIN is greater than or equal to NMAX-ERR. IF MIN is less than NMAX-ERR, block 56 follows block 54. The program is then directed to block 60 when MAX is not less than or equal to NMID and otherwise to block 58. The program branches from block 58 to label 5 of FIG. 3D if NNMAX is greater than or equal to MAX and, if not, passes to block 60. Block 60 selects label 7 of FIG. 3F if MIN is not greater than or equal to NMID and otherwise block 62 is entered. Block 62 further brings about transfer to label 6 of FIG. 3E if NNMIN is less than or equal to MIN. If NNMIN is more than MIN, program flow passes to label 7 of FIG. 3F.

Figure 3B:
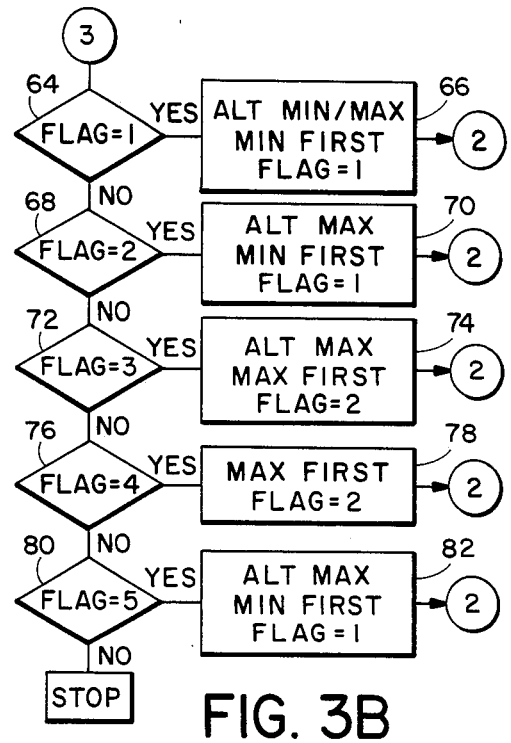

Referring to FIG. 3B, the procedure is directed to label 3 from block 52 of FIG. 3A if MAX is less than or equal to NMIN+ERR. From label 3, block 64 follows and selects block 66 if FLAG equals 1. In block 66, the MIN value is incremented by the OFFSET value, the MAX value is decremented by the OFFSET value, MIN and MAX are stored in memory with MIN first (so that it will be plotted before MAX when the vector representation is formed), FLAG is set to 1, and the program returns to label 2 of FIG. 3A. If FLAG is 2 then block 68 selects block 70 where MAX is decremented by the OFFSET amount, MIN is stored before MAX, FLAG is set equal to 1 and return is made to label 2. If FLAG is 3, flow is through blocks 64, 68, and 72 to block 74 where MAX is decremented, MAX is stored before MIN, FLAG is set to 2, and the program is passed to label 2. If FLAG=4, block 78 is reached via blocks 64, 68, 72 and 76. In block 78, MAX is stored first and FLAG is set equal to 2. Return is made to label 2. If FLAG is 5, the program reaches block 82 through blocks 68, 72, 76 and 80 where the MAX value is decremented, MIN is stored first, FLAG is set to 1, and the program returns to label 2.

Figure 3C:
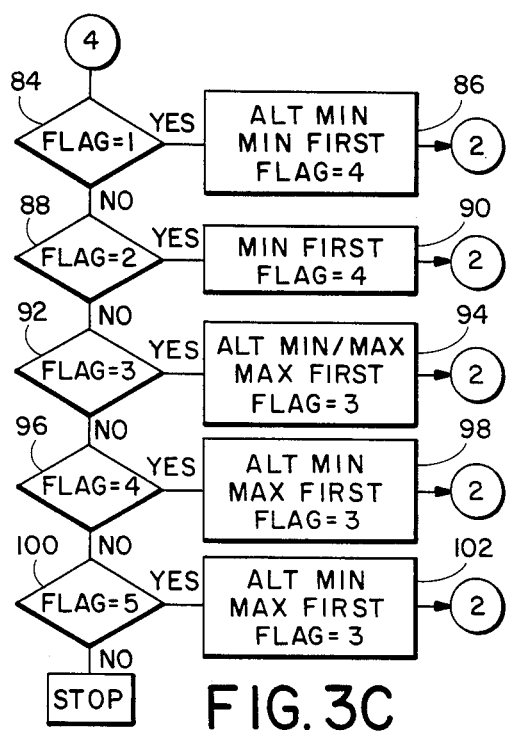

Referring to FIG. 3C, label 4 is selected from block 54 of FIG. 3A if MIN is greater than or equal to NMAX-ERR. From label 4, block 84 directs entrance to block 86 if FLAG equals 1. In block 86, the MIN value is incremented by the OFFSET value, MIN is stored before MAX, FLAG is set to 4, and the program returns back to label 2. If FLAG is 2 then block 88 is followed by block 90 where MIN is stored before MAX, FLAG is set equal to 4, with return to label 2. If FLAG is 3, the sequence enters block 94 from block 92, MIN is incremented, MAX is decremented, MAX is stored before MIN, FLAG is set to 3, and the program is passed to label 2. If FLAG=4, the program reaches block 98 via blocks 84, 88, 92 and 96. In block 98, MIN is incremented, MAX is stored first, and FLAG is set equal to 3. Return is then directed back to label 2. If FLAG is 5, the procedure from block 84 is through blocks 88, 92, 96 and 100 to block 102 where the MIN value is incremented, MAX is stored first, FLAG is set to 3, with program flow returned to label 2.

Figure 3D:
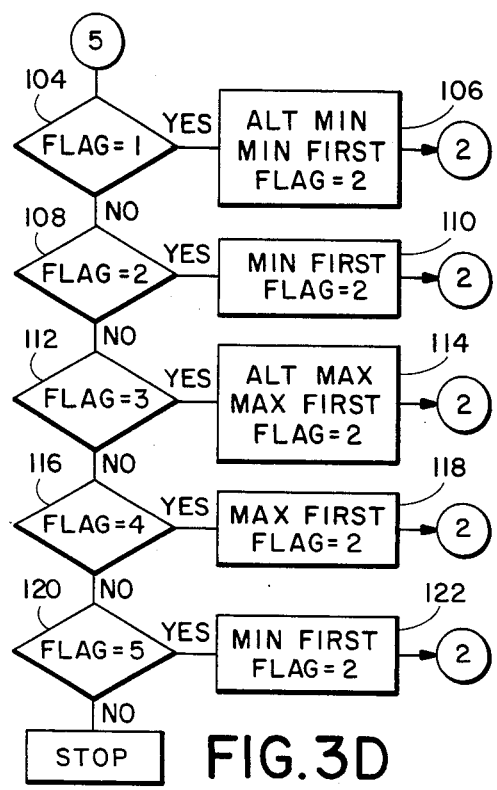

Referring to FIG. 3D, label 5 is reached via block 58 of FIG. 3A when MAX is less than or equal to NMID and NNMAX is greater than or equal to MAX. From label 5, block 104 directs entrance to block 106 if FLAG equals 1. In block 106, the MIN value is incremented by the OFFSET value, MIN is stored before MAX, FLAG is set to 2, and the program is directed back to label 2. If FLAG is 2, program flow passes from block 104 and through block 108 to block 110 where MIN is stored before MAX, FLAG is set equal to 2 and return is made to label 2. If FLAG is 3, the procedure is through blocks 104, 108, and 112 to block 114 where MAX is decremented, MAX is stored before MIN, FLAG is set to 2, and the program returns to label 2. If FLAG=4, the program arrives at block 118 via blocks 104, 108, 112, and 116. In block 118 MAX is stored first, and FLAG is set equal to 2. Return is then directed back to label 2. If FLAG is 5, block 122 is reached through blocks 108, 112, 116 and 120, and the MIN value is stored first, FLAG is set to 2, and program flow is passed to label 2.

Figure 3E:
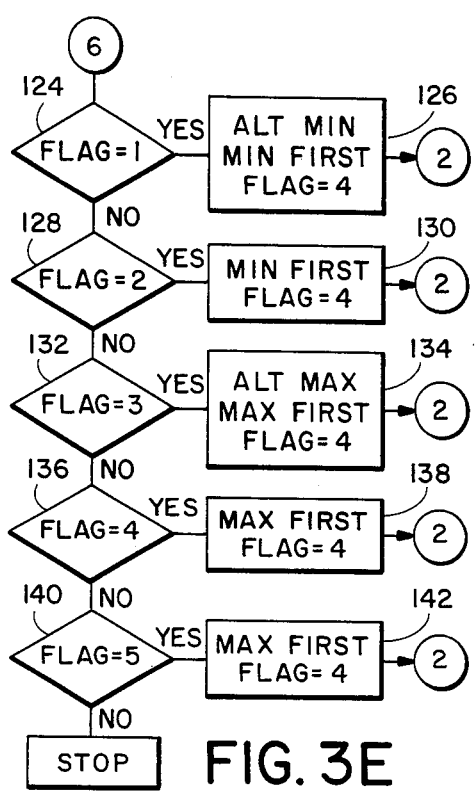

Referring to FIG. 3E, the procedure reaches label 6 from block 62 of FIG. 3A when MIN is greater than or equal to NMID and NNMIN is less than or equal to MIN. From label 6, block 124 directs the program to block 126 when FLAG equals 1. In block 126, the MIN value is incremented by the OFFSET value, MIN is stored before MAX, FLAG is set to 4, and the program is returned to label 2. If FLAG is 2, the procedure is from block 124 and through block 128 to block 130 where MIN is stored before MAX, FLAG is set equal to 4, and the flow returns to label 2. If FLAG is 3, block 134 is entered where MAX is decremented, MAX is stored before MIN, and FLAG is set to 4, followed by return to label 2. If FLAG equals 4, block 138 is reached via blocks 124, 128, 132, and 136. In block 138 MAX is stored first, and FLAG is set equal to 4, followed by return to label 2. If FLAG is 5, the program passes from block 124, through blocks 128, 132, 136 and 140 to block 142 where the MAX value is stored first, and FLAG is set to 4. Program flow then returns to label 2.

Figure 3F:
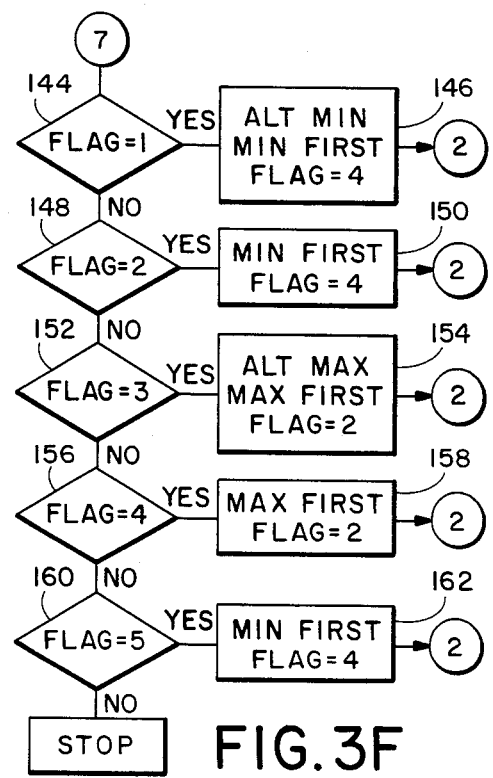

Referring to FIG. 3F, label 7 is reached from blocks 60 or 62 of FIG. 3A. From label 7, block 144 directs entrance to block 146 when FLAG equals 1. In block 146, the MIN value is incremented by the OFFSET value, MIN is stored before MAX, FLAG is set to 4, and the program is directed back to label 2. If FLAG is 2, then in block 150, reached via block 148, MIN is stored before MAX, FLAG is set equal to 4, and return is made to label 2. If FLAG is 3, the procedure is through blocks 144, 148, and 152 to block 154 where MAX is decremented, MAX is stored before MIN, and FLAG is set to 2, with return to label 2. If FLAG equals 4, block 158 is entered via blocks 144, 148, 152, and 156. In block 158 MAX is stored first and FLAG is set equal to 2, followed by return to label 2. If FLAG is 5, the procedure is from block 144, through blocks 148, 152, 156 and 160 to block 162 where the MIN value is stored first, FLAG is set to 4, and program flow is returned to label 2. The program stops at blOcks 80, 100, 120, 140 or 160 and returns to the calling routine if the current FLAG value is invalid, i.e., if it is not an integer from 1-5.

Each time the program returns to label 2, next MAX and MIN values associated with a next "current" sampling period are obtained in block 48 from the MEMADDR memory address of the acquisition memory, MEMADDR being incremented in block 42. The maximum and minimum values for the next two periods are also obtained in block 48. During the next program loop, prior to returning again to label 2, the program determines the order in which the minimum and maximum values for the current sampling period are to be plotted and also determines whether the minimum or maximum values for the sampling period are to be altered by the offset amount. The program then returns to label 2 to make the same determinations for the next succeeding sampling period.

The determinations as to whether the maximum or minimum values for a sampling period are to be plotted first, and as to whether the minimum or maximum values are to be altered by the offset amount, are made in a two-step fashion. In the first step, the MIN and MAX values for the current period are compared with the NMIN, NMAX, NMID, NNMIN and NNMAX values for the two succeeding periods to determine which one of the conditions of blocks 52, 54, 56 and 58, or 60 and 62 are satisfied. The program is then directed by one of these blocks to the appropriate label 3-7. The determination as to the ordering and altering of the MIN and MAX values for the current sampling period is then made according to the value of the FLAG variable.

When the current sampling period is the first period stored in the acquisition memory, the FLAG variable is set to 5. Otherwise the FLAG variable associated with the current sampling period is set to 1, 2, 3, or 4 during the preceding loop when the MIN and MAX variables were being ordered and adjusted for the preceding sampling period. Consequently, the FLAG variable associated with the current sampling period is set according to comparisions of the minimum and maximum values acquired during the current period with the minimum and maximum values acquired during the preceding and succeeding sampling periods. If the FLAG variable is set to a 1 or a 2, the minimum for the current sampling will be plotted before the maximum, while if the FLAG variable is set to a 3 or a 4, the maximum will be plotted before the minimum.

The FLAG variable for a current period will be set to a 1 or a 2 in block 66, 70, 74 or 78 when the condition of block 52 is satisfied during the preceding program loop. Then during the current program loop the minimum for the current period will be plotted first regardless of whether the conditions of any blocks 52-62 are satisfied. Thus the minimum is plotted first if the maximum value obtained during the preceding period is less than or equal to the sum of the minimum value obtained during the current sampling period and a selected error amount. This corresponds to rule 1 above.

The FLAG value will also be set to a 2 if the midpoint value of the sampling period and the maximum value obtained during the succeeding sampling period both exceed the maximum value obtained during the preceding sampling period, if any. The program will arrive at label 5 during the preceeding loop when this circumstance is true and thereafter the FLAG variable is set to 2 before the program returns to label 2. With the FLAG variable set to 2 the minimum for the current period will be plotted first. This corresponds to rule 2 above.

The minimum value will be plotted first if there is no preceding period (i.e., when FLAG=5) if the maximum value obtained for the sampling period is less than or equal to the sum of the minimum value obtained for the succeeding period and the selected error amount. This corresponds to rule 3 above. The minimum of a sampling period is also plotted before the maximum if there is no preceding period when the midpoint value of the first succeeding sampling period and the maximum value of the second succeeding sampling period both exceed the maximum value of the sampling period. This corresponds to rule 4 above.

The FLAG value will be set to a 3 or a 4, so that the maximum of a sampling period is plotted before the minimum, when the sum of the minimum value obtained during the preceding period and the error amount is equal to or greater than the maximum value obtained during the sampling period. This corresponds to rule 5 above. The FLAG value will also be set to a 4, when the midpoint value of the sampling period and the minimum value obtained during the succeeding sampling period are both less than or equal to the minimum value obtained during the preceding sampling period. This corresponds to rule 6.

When the FLAG is set to 5, the current period is the first period of the sampled waveform. When the sum of the minimum value obtained for the current period and the error amount is greater than or equal to the maximum value obtained for the succeeding period, the program flows via block 54 to block 82 where the minimum is plotted first according to rule 7. When the midpoint value of the first succeeding sampling period and the minimum value of the second succeeding sampling period both are less than or equal to the minimum value of the current sampling period, the program is via blocks 60 and 62 to block 142 where the maximum is plotted first according to rule 8 above. Rule 9 above is implemented when FLAG is 3 or 4 and none of the conditions of blocks 52-62 are satisfied. In such case program block 154 or block 158 is entered. FLAG can be set to 3 or 4 during the preceding program loop when the conditions of blocks 54 or 60 and 62 are satisfied so as to divert to labels 4, 6 or 7. Rule 10 is implemented when FLAG was 1, 2 or 5 for the preceding sampling period and none of the conditions of blocks 52-62 were satisfied. In such case the procedure was directed to block 146, 150 or 162 where the FLAG for the current sampling period was set to 4. On the next program loop, if the conditions of blocks 52-62 are again not satisfied, block 158 is entered where the maximum is plotted first. Rule 11 is implemented when none of the conditions of blocks 52-62 are satisfied and FLAG is neither 3 nor 4. In such case program flow is directed to block 146, 150 or 162 where the minimum is plotted first.

The flowchart of FIGS. 3A-3F also implements rules a-d above regarding the incrementing of the minimum and the decrementing of the maximum. For instance, if the minimum for the preceding period was plotted before the maximum and the maximum value acquired during the preceding period is less than or equal to the sum of the minimum value acquired during the sampling period and the error amount, then the FLAG value for the current sampling period is set to 1 in either block 66 or 70 during the preceding program loop. During the current program loop, the minimum for the current period is then incremented by the offset amount because the minimum is always incremented when FLAG is equal to 1. By a similar analysis it can be shown that the flow chart of FIGS. 3A-3F also implements rules b, c, and d above.

While a preferred embodiment of the present invention has been shown and described, it will be apparent to those skilled in the art that many changes and modifications may be made without departing from the invention in its broader aspects. For instance, while the invention has been described in conjunction with a sampling type system which determines minima and maxima by sampling a waveform, the invention may also be practiced in conjunction with continuous peak detection circuits which produce minima and maxima values during successive measurement periods without sampling. The appended claims are therefore intended to cover all such changes and modifications as fall within the true spirit and scope of the invention.

What is claimed is:

1. The method of displaying a representation of the amplitude variations of an analog signal, the method comprising the steps of:
   a. determining the minimum and maximum magnitudes of the signal during each of a plurality of successive meaurement periods;
   b. comparing at least one of said maximum and minimum magnitudes associated with a selected one of said measurement periods to at least one of said maximum and minimum magnitudes associated with another of said measurement periods; and
   c. displaying a vector on a screen, said vector representing the amplitude variation of said analog signal during said selected measurement period, said vector having a first endpoint position on said screen displaced along a first screen axis according to the maximum magitude determined for said selected measurement period and a second endpoint position on said screen displaced along said first axis according to the minimum magnitude determined for said selected measurement period, said endpoints being ordered along a second screen axis, orthogonal to the first screen axis, according to at least one said comparison 2. The method of displaying a representation of the amplitude variations of an analog signal, the method comprising the steps of:
   a. determining the minimum and maximum magnitudes of the signal during each of a plurality of successive measurement periods;
   b. comparing at least one of said maximum and minimum magnitudes associated with a selected one of said measurement periods to at least one of said maximum and minimum magnitudes associated with another of said measurement periods;
   c. selectively decrementing said maximum magnitude associated with said selected measurement period by a first selected offset amount according to at least one comparison; and
   d. selectively incrementing said minimum magnitude associated with said selected measurement period by a second selected offset amount according to at least one said comparison.

3. The method of claim 2 further comprising the step of:
   e. displaying a vector on a screen, said vector representing the amplitude variation of said analog signal during said selected measurement period, said vector having a first endpoint position on said screen vertically displaced according to said selectively decremented maximum magnitude associated with said selected measurement period and a second endpoint position on said screen vertically displaced according to said selectively incremented minimum magnitude associated with said selected measurement period, said endpoints being positioned in horizontal order according to at least one said comparison.

4. The method of claim 2 wherein at least one of said first and said second selected offset amounts is proportional to the difference between said maximum and minimum magnitudes associated with said selected measurement period.

5. The method of displaying a representation of the amplitude variations of an analog signal, comprising the steps of:
   a. determining the minimum and maximum magnitudes of the analog signal during each of a plurality of successive measurement periods;
   b. comparing at least one of said maximum and minimum magnitudes associated with a selected one of said measurement periods to at least one of said maximum and minimum magnitudes associated with another of said measurement periods;
   c. selectively decrementing said maximum magnitude associated with said selected measurement period by a first selected offset amount according to at least one said comparison;
   d. selectively incrementing said minimum magnitude associated with said selected measurement period by a second selected offset amount according to at least one said comparison; and
   e. displaying a vector on a screen, said vector representing the amplitude variation of said analog signal during said selected measurement period, said vector having a first endpoint position on said screen vertically displaced according to said selectively decremented maximum value associated with said selected measurement period and a second endpoint position on said screen vertically displaced according to said selectively incremented minimum value associated with said selected measurement period, said endpoints being positioned in selected horizontal order according to said comparison.

6. The method of claim 5 wherein the second endpoint of said vector horizontally precedes the first endpoint when the maximum magnitude associated with a preceding period is less than the sum of the minimum magnitude associated with the selected measurement period and a selected error amount.

7. The method of claim 6 wherein the second endpoint of said vector horizontally precedes the first endpoint if one half of the sum of the maximum and minimum magnitudes of the selected measurement period and the maximum magnitude associated with a succeeding measurement period both exceed the maximum magnitude associated with the preceding measurement period.

8. The method of claim 7 wherein the first endpoint of said vector horizontally precedes the plotted second endpoint if the sum of the minimum magnitude associated with the preceding period and the error amount is equal to or greater than the maximum magnitude associated with the selected measurement period.

9. The method of claim 8 wherein the first endpoint of said vector horizontally precedes the second endpoint if one half of the sum of the minimum and maximum magnitudes associated with the sampling period and the minimum magnitude associated with the succeeding measurement period are both less than or equal to the minimum magnitude associated with the preceding measurement period.

* * * * *